(12) United States Patent
Chang

(10) Patent No.: US 6,753,701 B2
(45) Date of Patent: Jun. 22, 2004

(54) DATA-SAMPLING STROBE SIGNAL GENERATOR AND INPUT BUFFER USING THE SAME

(75) Inventor: Chi Chang, Taipei (TW)

(73) Assignee: Via Technologies, Inc., Taipei (TW)

( * ) Notice: Subject to any disclaimer, the term of this patent is extended or adjusted under 35 U.S.C. 154(b) by 58 days.

(21) Appl. No.: 10/138,268

(22) Filed: May 6, 2002

(65) Prior Publication Data

US 2003/0090294 A1 May 15, 2003

(30) Foreign Application Priority Data

Nov. 9, 2001 (TW) .......................... 90127903 A

(51) Int. Cl.$^7$ .............................................. H03K 19/00
(52) U.S. Cl. ............................ 326/93; 326/29; 327/198
(58) Field of Search .............................. 326/14, 29, 82, 326/93; 237/23, 198, 379

(56) References Cited

U.S. PATENT DOCUMENTS 6,016,066 A * 1/2000 Ilkbahar .................... 327/23
6,288,577 B1 * 9/2001 Wong ........................ 327/65

* cited by examiner

Primary Examiner—Daniel D. Chang
(74) Attorney, Agent, or Firm—Rabin & Berdo, P.C.

(57) ABSTRACT

A data-sampling strobe signal generator and an input buffer using the same. The data-sampling strobe signal includes a intermediate signal generator, a comparison circuit and a logic circuit. The intermediate signal generator compares non-inverting/inverting strobe signals and generates an intermediate signal based on the comparison result. The comparison circuit compares a reference voltage with the non-inverting strobe signal and the inverting strobe signal, respectively, and outputs a control signal. The control signal is enabled when one of the non-inverted/inverting strobe signals is higher than the reference voltage and the other is lower than the reference voltage, and disabled when the non-inverting/inverting strobe signals are the same logical level. The logic circuit receives the intermediate signal and the control signal and generates the data-sampling strobe signal from the intermediate signal when the control signal is enabled. In addition, the data-sampling strobe signal is a constant logic level when the control signal is disabled.

9 Claims, 3 Drawing Sheets

DATA-SAMPLING STROBE SIGNAL GENERATOR AND INPUT BUFFER USING THE SAME

BACKGROUND OF THE INVENTION

1. Field of the Invention

The present invention relates to an input buffer, in particular, to a data-sampling strobe clock generator in the input buffer, which uses non-inverting/inverting strobe signals to determine the strobe points for comparing the data signal and reference voltage, thereby overcoming timing issues while the system is in the idle state and when changing from the idle state to the operating state.

2. Description of the Related Art

FIG. 1 (Prior Art) is a circuit diagram of a conventional input buffer. In prior design implementation of the input buffer, non-inverting/inverting strobe signals (STROB/STROB#) are sent to a differential comparator 10 which generates a data-sampling strobe signal (STB) in view of the crossing points of these two strobe signals. Since the non-inverting/inverting strobe signals (STROB/STROB#) have a T/2 phase difference, where T represents the period of these two strobe signals, adjacent rising/falling edges of the data-sampling strobe signal (STB) are spaced out T/2 apart. In addition, differential comparator 20 receives a data signal (DATA) and a reference voltage (VREF) and compares them based on the rising/falling edges of the data-sampling strobe signal (STB), for determining logic levels of the output signal (DOUT), such as "1" or "0."

FIG. 2 (Prior Art) is a timing diagram illustrating the relationships between the data signal (DATA), the reference voltage (VREF) and the non-inverting/inverting strobe signal (STROB/STROB#) in the conventional input buffer. As shown in the figure, a crossing point T1 occurs when the level of the non-inverting strobe signal (STROB) is going down and the level of the inverting strobe signal (STROB#) is going up. At this time, the level of the data signal (DATA) is higher than the reference voltage (VREF) and thus the output signal (DOUT) is set to be "1." On the other hand, a crossing point T2 occurs when the level of the non-inverting signal (STROB) is going up and the level of the inverting signal (STROB#) is going down. At this time, the level of the data signal (DATA) is lower than the reference voltage (VREF) and thus the output signal (DOUT) is set to be "0."

In fact, for some current bus implementation, such as Intel Pentium 4 microprocessor, the non-inverting/inverting strobe signals (STROB/STROB#) will all stay at logic "1" when they are idle. However, the conventional scheme of keeping the non-inverting/inverting strobe signals (STROB/STROB#) at logic "1" during the idle period has the following drawbacks:

1. When the system initially switches from the idle state to the normal operating state, a skew problem may occur at the first crossing point of the non-inverting/inverting strobe signals (STROB/STROB#), which corresponds to the first data sampling operation. FIG. 3 (Prior Art) is a timing diagram of the non-inverting/inverting strobe signals (STROB/STROB#) in the conventional input buffer, which include the part corresponding to the state switch of the system from the idle state to the normal operating state. As shown in the figure, in the beginning of the idle state, the non-inverting/inverting strobe signals (STROB/STROB#) stay at the logic high level. At the time point T3, the non-inverting strobe signal (STROB) begins to go down from the logic high level and the inverting strobe signal (STROB#) still remains unchanged. However, the differential comparator 10 is able to sense the voltage difference between the non-inverting/inverting strobe signals (STROB/STROB#) since the non-inverting/inverting strobe signals (STROB/STROB#) start to differentiate and thus the time point T3 is set as a crossing point, which is earlier than the regular crossing point T4 by a time period Δt. The time skew may cause reading errors of the initial data, especially for high-speed systems.

2. Since all of the strobe signals (STROB/STROB#) stay at the logic high level in the idle state, the state of the data-sampling strobe signal (STB) generated by the differential comparator 10 may become unknown. Therefore, any small noise between the non-inverting/inverting strobe signals (STROB/STROB#) may induce extra glitch and cause the system to fail.

SUMMARY OF THE INVENTION

An object of the present invention is to provide a data-sampling strobe signal generator and an input buffer using the same, which can suppress the instability of the data-sampling strobe signal (STB) in the idle state due to the effect of noise.

Another object of the present invention is to provide a data-sampling strobe signal generator and an input buffer using the same, which can eliminate the skew phenomenon of the initial crossing point when the system switches from the idle state to the normal operating state.

The present invention achieves the above-indicated objects by providing a data-sampling strobe signal generator for generating a data-sampling strobe signal according to non-inverting/inverting strobe signals. The data-sampling strobe signal comprises an intermediate signal generator, a comparison circuit and a first logic circuit. The intermediate signal generator compares the non-inverting strobe signal and the inverting strobe signal and generates an intermediate signal based on the comparison result. The comparison circuit compares a reference voltage with the non-inverting strobe signal and the inverting strobe signal, respectively, and outputs a control signal. The control signal is enabled when one of the non-inverted/inverting strobe signals is higher than the reference voltage and the other is lower than the reference voltage, and disabled when the non-inverting/inverting strobe signals are the same logical level. The first logic circuit receives the intermediate signal and the control signal and generates the data-sampling strobe signal from the intermediate signal when the control signal is enabled. In addition, the data-sampling strobe signal is a constant logic level when the control signal is disabled.

In addition, the present invention also provides an input buffer. The input buffer includes a data comparator for comparing the data signal with the reference voltage in view of the data-sampling strobe signal and a data-sampling strobe signal generator, which has the same circuit structure described above, for generating the data-sampling strobe signal.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The data-sampling strobe signal generator and input buffer using the same, as disclosed in the present invention, add additional circuitry for comparing the non-inverting/inverting strobe signals (STROB/STROB#) with the reference voltage (VREF) to the original differential comparator. It can suppress the instability of the data-sampling strobe signal (STB) in the idle state due to the effect of noise and eliminate the skew phenomenon of the initial crossing point when the system switches from the idle state to the normal operating state.

Figure 4:
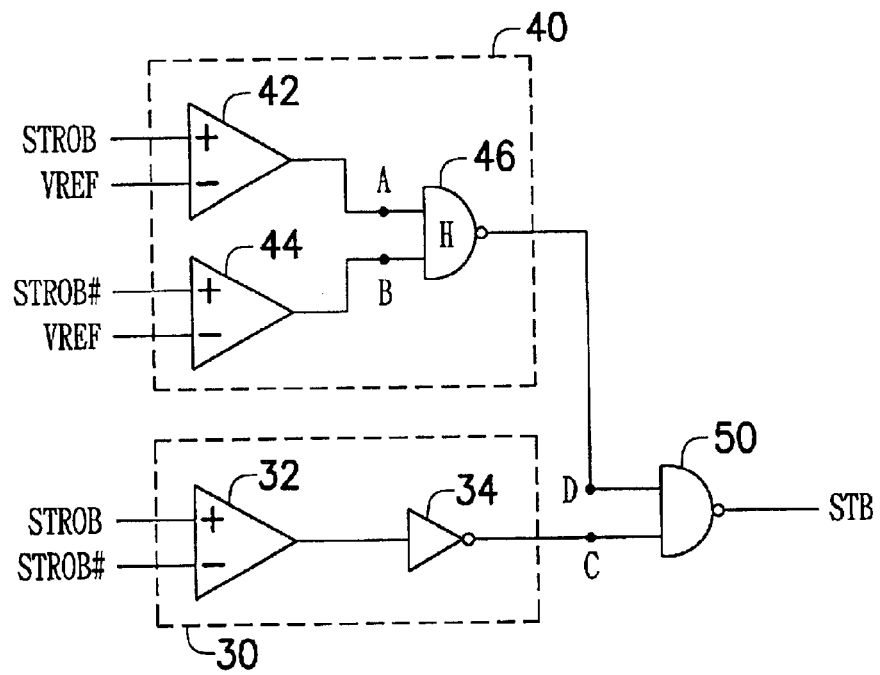
FIG. 4 is a circuit diagram of a data-sampling strobe signal generator according to the preferred embodiment of the present invention.

FIG. 4 is a circuit diagram of a data-sampling strobe signal generator according to the preferred embodiment of the present invention. As shown in FIG. 4, the data-sampling strobe signal generator includes an intermediate signal generator 30, a comparison circuit 40 and an NAND logic gate 50.

The intermediate signal generator 30 is comprised of a differential comparator 32 and an inverter 34 and generates an intermediate signal at a node C. The differential comparator 32 receives the non-inverting strobe signal (STROB) and the inverting strobe signal (STROB#) and outputs a logic signal in logic "1" or "0" state according to its comparing result. The inverter 34 inverses the output of the differential comparator 32 and generates the intermediate signal at the node C.

The comparison circuit 40 includes a differential comparator 42, a differential comparator 44 and an NAND gate 46. The differential comparator 42 receives the non-inverting strobe signal (STROB) and the reference voltage (VREF) and outputs a logic signal at a node A. The differential comparator 44 receives the inverting strobe signal (STROB#) and the reference voltage (VREF) and outputs a logic signal at a node B. The NAND gate 46 receives the output of the differential comparators 42 and 44 and generates a control signal at a node D. The function of the comparison circuit 40 is to determine the relation between the non-inverting/inverting strobe signals (STROB/STROB#).

The NAND gate 50 receives the intermediate signal at node C and the control signal at node D and generates the data-sampling strobe signal (STB) for data sampling.

Figure 5:
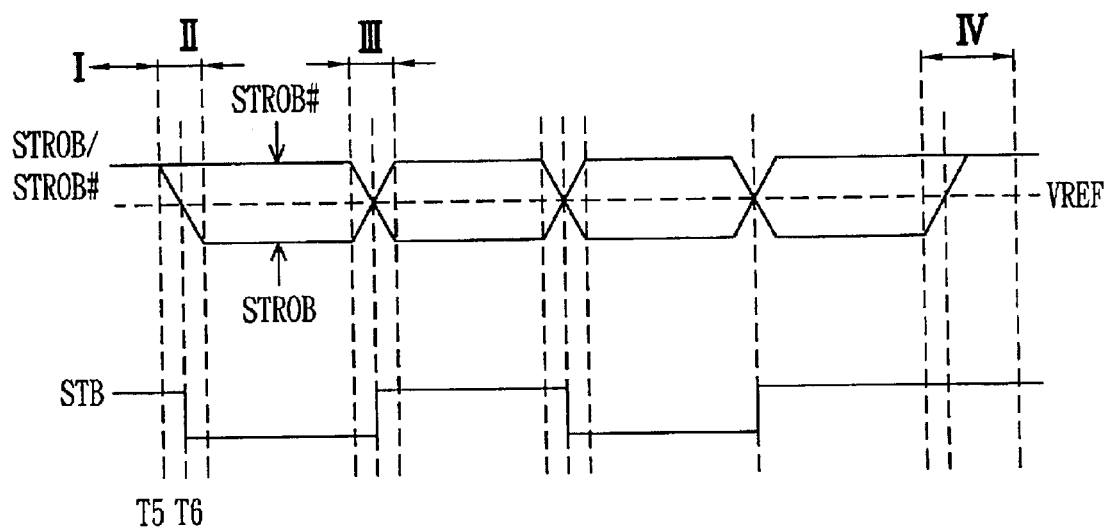
FIG. 5 is a timing diagram illustrating the non-inverting/inverting strobe signals (STROB/STROB#) and the data data-sampling strobe signal (STB) in the preferred embodiment of the present invention.

FIG. 5 is a timing diagram illustrating the non-inverting/inverting strobe signals (STROB/STROB#) and the data data-sampling strobe signal (STB) in the preferred embodiment of the present invention. The operation of the circuit shown in FIG. 4 will be described in detail in view of FIG. 5.

Region I

In region I (before the time point T5), the system is in the idle state. Thus, both of the non-inverting/inverting strobe signals (STROB/STROB#) stay at logic "1" level. Since the logic signal at node A is "1" and the logic signal at node B is "1", the control signal at node D is "0". Thus, the data-sampling strobe signal (STB) is guaranteed to be "1" no matter the logic level of the intermediate signal at node C. Accordingly, in the idle state, the logic level of the data-sampling strobe signal (STB) remains at the logic "1" level even if noise between the non-inverting/inverting strobe signals (STROB/STROB#) occurs. The first object of the present invention, which is to suppress the instability of the data-sampling strobe signal (STB) in the idle state, is thus obtained.

Region II

In region II, the system starts to switch from the idle state to the normal operating state. The non-inverting strobe signal (STROB) starts to go low and the inverting strobe signal (STROB#) still stays at the logic "1" level. When the non-inverting strobe signal (STROB) starts to go down, the differential comparator 32 can sense the voltage difference therebetween and set the intermediate signal at node C to be logic "1" level. Since the control signal at node D is "0," the data-sampling strobe signal (STB) remains at the logic "1" level. On the other hand, the differential comparator 42 is able to sense the voltage difference between the non-inverting strobe signal (STROB) and the reference voltage (VREF) when the non-inverting strobe signal (STROB) decreases to be lower than the reference voltage (VREF). At this time, the logic signal at node A is logic "0" and thus the control signal at node D becomes logic "1." At this time, the data-sampling strobe signal (STB) changes its logic level to "0." In other words, the initial logic transition of the data-sampling strobe signal (STB) depends on the rising edge of the control signal at node D, i.e. the crossing point of the non-inverting strobe signal (STROB) and the reference voltage (VREF). It can solve the skew problem in the first data strobe when the system switches from the idle state to the normal operating state. The second object of the present invention, which is to eliminate the skew phenomenon of the initial data sampling operation, is obtained. It is noted that the above description can also apply to the condition in which the inverting strobe signal (STROB#) starts to go low and the non-inverting strobe signal (STROB) still remains unchanged in the initial data sampling operation.

Region III

In region III, because one of the non-inverting/inverting strobe signals (STROB/STROB#) is higher than the reference voltage (VREF) and the other is lower than the reference voltage (VREF), none of the logic signals at node A and node B is "1" at the same time and thus the control signal at node D is always "1." In addition, the logic level of the data-sampling strobe signal (STB) is determined by the intermediate signal at node C. In other words, after the first data sampling strobe, the data-sampling strobe signal (STB) is determined by non-inverting/inverting strobe signals (STROB/STROB#) in the fully differential scheme.

Region IV

In region IV, the non-inverting/inverting strobe signals (STROB/STROB#) are all back to "1." Therefore, the control signal at node D is "0" and the data-sampling strobe signal (STB) becomes "1" again.

According to the above analysis, when the comparison circuit 40 determines that one of the non-inverting/inverting strobe signals (STROB/STROB#) is higher than the reference voltage (VREF) and the other is lower than the reference voltage (VRRF), the control signal at node D is enabled (logic high level). Thus, the data-sampling strobe signal (STB) is fully determined by the intermediate signal at node C. When the non-inverting/inverting strobe signals (STROB/STROB#) stay at the logic high level in the idle state, the control signal at node D is disabled (logic low level) and the NAND gate 50 outputs a constant logic high level.

Figure 6:
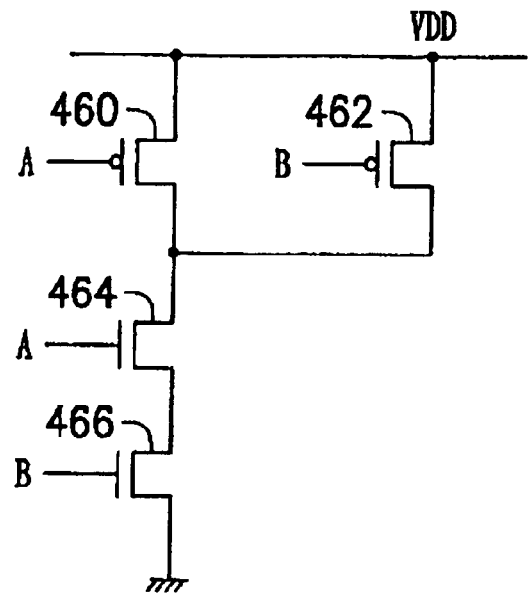
FIG. 6 is a circuit diagram of an example of the high-skew NAND logic gate in the preferred embodiment of the present invention.

In a real system, the reference voltage (VREF) may drift slowly and the crossing point of the non-inverting/inverting strobe signals (STROB/STROB#) may not be the same as the reference voltage (VREF). Therefore, it is possible for the logic signals at node A and node B to accidentally become higher than the reference voltage (VREF) at the same time, and thus the control signal at node D becomes "0" even though the system is not in the idle state. In the preferred embodiment, the NAND gate 46 is preferably a high-skew NAND gate, to avoid this situation. FIG. 6 is a circuit diagram of an example of the high-skew NAND logic gate in the preferred embodiment of the present invention. In the NAND logic gate, PMOS transistors 460 and 462 have bigger sizes and NMOS transistors 464 and 466 have smaller sizes. The high-skew two-input NAND circuit gate can filter out the possible glitch since both of the logic signals at node A and node B need to stay at logic "1" for enough time to discharge the charges in node D through this high-skew NAND logic gate. Therefore, the accidental case, in which the control signal at node D becomes "0" due to the drift of the reference voltage (VREF), can be avoided. In addition, the PMOS/NMOS size ratio of the NAND logic gate can determine how much overlapping noise between the logic signals at node A and node B can be filtered out.

Figure 1:
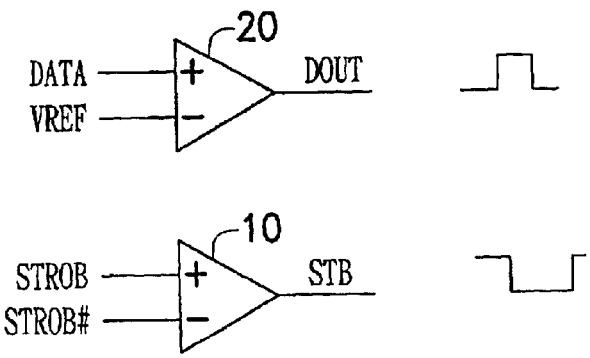
FIG. 1 (Prior Art) is a circuit diagram of a conventional input buffer.
Figure 2:
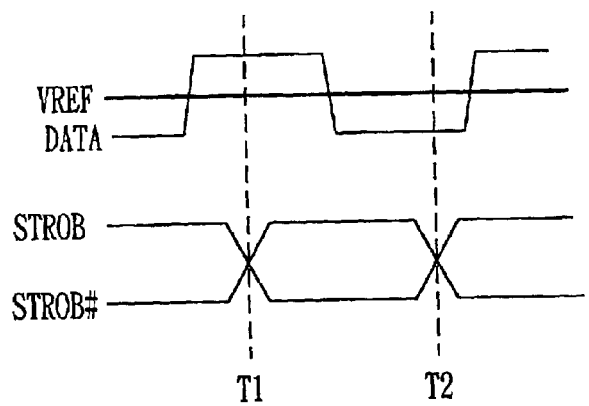
FIG. 2 (Prior Art) is a timing diagram illustrating the relationships between the data signal DATA, the reference voltage (VREF) and the non-inverting/inverting strobe signal (STROB/STROB#) in the conventional input buffer.
Figure 3:
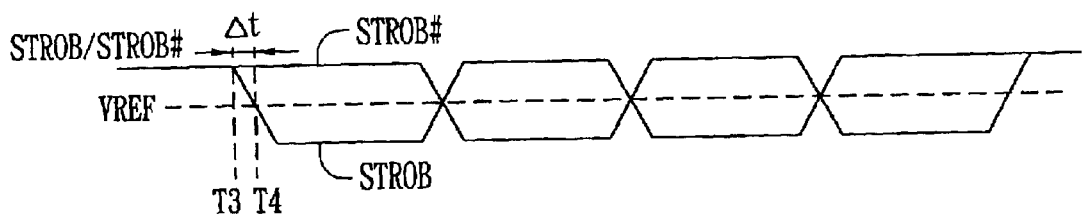
FIG. 3 (Prior Art) is a timing diagram of the non-inverting/inverting strobe signals (STROB/STROB#) in the conventional input buffer.
Figure 7:
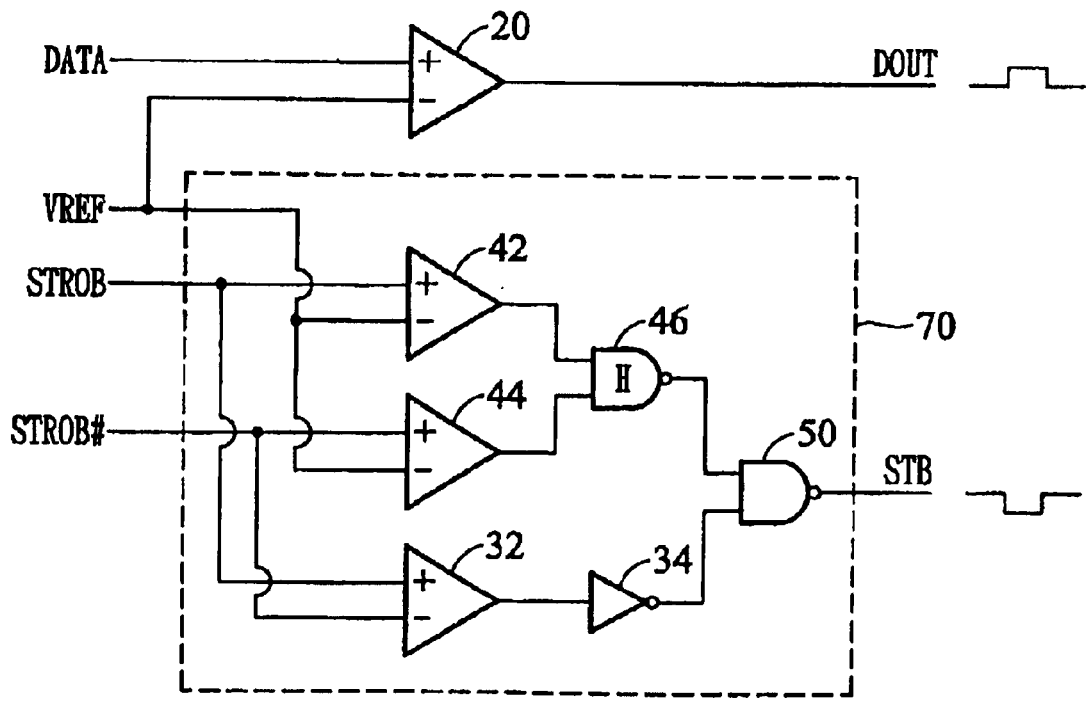
FIG. 7 is a circuit diagram of an input buffer using the data-sampling strobe signal generator of FIG. 4.

In addition, the present invention also provides an input buffer comprising the data-sampling strobe signal generator disclosed in the present application. FIG. 7 is a circuit diagram illustrating the input buffer according to the preferred embodiment of the present invention. As shown in FIG. 7, a data-sampling strobe signal generator 70 generates a data-sampling strobe signal (STB) according to non-inverting/inverting strobe signals (STROB/STROB#) and a reference voltage (VREF). The configuration of the data-sampling strobe signal generator 70 is identical to the circuit shown in FIG. 4. A data comparator 20 receives a data signal (DATA) as well as the reference voltage (VREF) for comparison to determine logic levels of the output signal (DOUT). In comparison with the conventional input buffer shown in FIG. 1, the differential comparator 10 is replaced by the data-sampling strobe signal generator 70.

The advantages of the present invention are described as follows:

1. All falling/rising edges of the data-sampling strobe signal (STB) (including the first strobe) can be used as the sampling points with respect to the data signal DATA. In the first strobe operation, the non-inverting strobe signal (STROB) is compared with the reference voltage (VREF), and in the rest of the strobe operations, the non-inverting strobe signal (STROB) is compared with the inverting strobe signals (STROB#). Thus, the setup time of the first data signal (DATA) can still be maintained, which is critical for high-speed I/O designs.

2. In the idle state, the data-sampling strobe signal (STB) is kept as "1." Thus, during the idle state, the data-sampling strobe signal (STB) is stable if the noise between the non-inverting/inverting strobe signals (STROB/STROB#) is lower than the voltage level of the reference voltage (VREF).

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A data-sampling strobe signal generator for generating a data-sampling strobe signal according to a non-inverting strobe signal and an inverting strobe signal that are the same logical level in an idle state, comprising:

an intermediate signal generator for generating an intermediate signal by comparing the non-inverting strobe signal and the inverting strobe signal;

a comparison circuit for comparing a reference voltage with the non-inverting strobe signal and the inverting strobe signal and outputting a control signal, the control signal being enabled when the non-inverting strobe signal or the inverting strobe signal is higher than the reference voltage and the other is lower than the reference voltage, the comparison circuit including a first differential comparator for comparing the non-inverting strobe signal and the reference voltage, a second differential comparator for comparing the inverting strobe signal and the reference voltage, and a high-skew logic gate for receiving output signals of the first differential comparator and the second differential comparator and generating the control signal, the control signal being enabled when the non-inverting strobe signal or the inverting strobe signal is higher than the reference voltage and the other is lower than the reference voltage, and disabled when the non-inverting strobe signal and the inverting strobe signal are the same logical level in the idle state; and a first logic circuit for receiving the intermediate signal and the control signal and generating the data-sampling strobe signal from the intermediate signal when the control signal is enabled.

2. A data-sampling strobe signal generator as claimed in claim 1, wherein the data-sampling strobe signal is a constant logic level and the control signal is disabled when the non-inverting strobe signal and the inverting strobe signal are the same logical level in the idle state.

3. A data-sampling strobe signal generator as claimed in claim 1, wherein the high-skew logic gate is a NAND gate.

4. A data-sampling strobe signal generator as claimed in claim 1, wherein the first logic circuit is a NAND gate.

5. A data-sampling strobe signal generator for generating a data-sampling strobe signal according to a non-inverting strobe signal and an inverting strobe signal, which are the same logic level in an idle state, comprising:

an intermediate signal generator for generating an intermediate signal by comparing the non-inverting strobe signal and the inverting strobe signal;

a first differential comparator for comparing the non-inverting strobe signal and the reference voltage;

a second differential comparator for comparing the inverting strobe signal and the reference voltage;

a first NAND gate for receiving output signals of the first differential comparator and the second differential comparator and generating a control signal, the control signal at a logic high level when the non-inverting strobe signal or the inverting strobe signal is higher than the reference voltage and the other is lower than the reference voltage, and the output control signal at a logic low level when the non-inverting strobe signal and the inverting strobe signals are the same logic level; and a second NAND gate for receiving the intermediate signal and the control signal and generating the data-sampling strobe signal from the intermediate signal when the control signal is at the logic high level, the data-sampling strobe signal being a constant voltage when the control signal is at the logic low levels;

wherein the first NAND gate is a high-skew logic gate.

6. An input buffer for sampling a data signal in view of a data-sampling strobe signal generated by a non-inverting strobe signal and an inverting strobe signal, the non-inverting strobe signal and the inverting strobe signal are the same logical level in an idle state, comprising:

a data comparator for comparing the data signal with a reference voltage in view of the data-sampling strobe signal; and an intermediate signal generator for generating an intermediate signal by comparing the non-inverting strobe signal and the inverting strobe signal;

a comparison circuit for comparing the reference voltage with the non-inverting strobe signal and the inverting strobe signal and outputting a control signal, the control signal being enabled when the non-inverting strobe signal or the inverting strobe signal is higher than the reference voltage and the other is lower than the reference voltage, the comparison circuit including a first differential comparator for comparing the non-inverting strobe signal and the reference voltage, a second differential comparator for comparing the inverting strobe signal and the reference voltage, and a high-skew logic gate for receiving output signals of the first differential comparator and the second differential comparator and generating the control signal, the control signal being enabled when the non-inverting strobe signal or the inverting strobe signal is higher than the reference voltage and the other is lower than the reference voltage, and disabled when the non-inverting strobe signal and the inverting strobe signal are the same logical level in the idle state; and a first logic circuit for receiving the intermediate signal and the control signal and generating the data-sampling strobe signal from the intermediate signal when the control signal is enabled.

7. An input buffer as claimed in claim 6, wherein the data-sampling strobe signal is a constant logic level and the control signal is disabled when the non-inverting strobe signal and the inverting strobe signal are the same logical level in the idle state.

8. An input buffer as claimed in claim 6, wherein the high-skew logic gate is a NAND gate.

9. An input buffer as claimed in claim 6, wherein the first logic circuit is a NAND gate.

* * * * *